United States Patent [19]
Söderberg et al.

[11] Patent Number: 5,978,194
[45] Date of Patent: Nov. 2, 1999

[54] DEVICE AND METHOD FOR COUNTING FLANKS OF ELECTRICAL PULSES

[75] Inventors: Sten Söderberg, Haninge; Robin Gador, Hägersten, both of Sweden

[73] Assignee: Telefonaktiebolaget LM Ericsson, Stockholm, Sweden

[21] Appl. No.: 08/905,076

[22] Filed: Aug. 1, 1997

[30] Foreign Application Priority Data

Aug. 2, 1996 [SE] Sweden .................................. 9602917

[51] Int. Cl.[6] ....................................................... H02H 3/18
[52] U.S. Cl. ............................... 361/87; 361/86; 361/101
[58] Field of Search ........................... 361/87, 58, 93–94, 361/97–98, 100, 101, 104, 78–79, 86

[56] References Cited

U.S. PATENT DOCUMENTS

| | | | |
|---|---|---|---|
| 4,127,886 | 11/1978 | Easter | 361/18 |
| 4,423,457 | 12/1983 | Brajder | 361/86 |
| 5,095,261 | 3/1992 | Schoofs | 323/222 |

FOREIGN PATENT DOCUMENTS

| | | |
|---|---|---|
| 0288015A2 | 10/1988 | European Pat. Off. . |
| 0645637A2 | 3/1995 | European Pat. Off. . |
| 3920658 | 12/1989 | Germany . |
| 4106690 | 10/1992 | Germany . |

*Primary Examiner*—Michael J. Sherry
*Attorney, Agent, or Firm*—Burns, Doane, Swecker & Mathis, L.L.P.

[57] ABSTRACT

A device for counting the edges of electric pulses is disclosed and comprises a first capacitor connected in series with a pump circuit, which comprises a first resistance in series with a first diode connected in parallel with a second resistance, and a second capacitor connected in parallel with the first resistance. When a voltage, which is caused by one of the edges of an electric pulse, is applied across the first capacitor and the pump circuit, the first and second capacitors are charged in series with a charge that is essentially determined by the second capacitor. A first input of a comparator is connected to the connection point between the first capacitor and the pump circuit and a second input of the comparator is connected to a comparison potential, in order to indicate that a given approximate number of pulses have been counted when the voltage across the first capacitor exceeds a threshold level determined by the comparison potential.

11 Claims, 3 Drawing Sheets

DEVICE AND METHOD FOR COUNTING FLANKS OF ELECTRICAL PULSES

FIELD OF INVENTION

The present invention relates to a device and to a method for counting the edges of electric pulses, and more specifically to counting edges of electric pulses to enable a current valve in an electronic fuse to close subsequent to the valve having oscillated a predetermined number of times. Although the invention is preferably included in a telephony system, its use is not restricted to such systems.

DESCRIPTION OF THE BACKGROUND ART

An electronic fuse or current limiter is triggered when the current passing therethrough is too high. Such high currents can occur for two reasons, one of which is that a load connected to the network overloads the network, and the other is when a short circuit occurs. When a circuit is subjected to an excessively high load temporarily, for instance when starting-up a capacitive load, it is of interest to activate the fuse when too much current passes through the circuit while, at the same time, ensuring that the load is charged so as to achieve normal operation, since the excessively high current only occurs in a starting-up mode in such operational conditions. EP-A2-0 288 015 describes a device which could be used conveniently to close and open a current valve in an electronic fuse despite the device being intended for inductive loads. However, this known device has no function which closes the current valve subsequent to said valve having oscillated over a given time period, such a function being of interest in preventing the current valve from breaking-up. It is therefore of interest to count the pulses that control activation and deactivation of the current valve when such pulses exist as a result of an overload or a short circuit and to close, deactivate, the current valve or current limiter after a given period of time has lapsed, so as to prevent the valve from breaking-up as a result of said oscillations. When an excessively high load occurs temporarily, the pulse quotient will also vary and therewith make it difficult to count different types of pulse.

U.S. Pat. No. 4,127,886 describes an overcurrent protective circuit that includes a transistor which begins to conduct upon detection of an overcurrent and which is maintained in a conductive state by means of the charge in a capacitor, so as to prevent oscillation.

SUMMARY OF THE INVENTION

The present invention addresses the problem of how the edges of electronic pulses can be counted independently of the pulse quotient in an inexpensive and simple device, so as to avoid the break-up of a current valve.

One object of the present invention is therefore to provide an inexpensive and simple device which counts the edges of electronic pulses independently of the pulse quotient, so as to prevent a current valve from breaking-up.

The problem is solved by charging with each pulse a first and a second capacitor in series with a voltage caused by one of the pulse edges. The charge obtained by the first capacitor is determined by the second capacitor. The voltage across the first capacitor is compared with a threshold voltage and a given pulse count indicates whether or not the voltage has exceeded the threshold voltage.

The problem is thus solved by a device for counting electric pulses, and an electronic fuse that includes such a device, wherein a first capacitor is connected in series to a pump circuit which includes a first resistance in series with a first diode, both connected in parallel with a second resistance, and a second capacitor connected in parallel with the first resistance. When a voltage caused by one of the edges of an electric pulse is applied across the first capacitor and the pump circuit, the first and the second capacitor are charged in series with a charge that is determined essentially by the second capacitor. A first input of a comparison means is connected to the connection point between the first capacitor and the pump circuit, while a second input of the comparison means is connected to a comparison potential in order to indicate a given approximate number of pulses that have been counted when the voltage across the first capacitor exceeds a threshold level determined by the comparison potential.

The problem is also solved by a method in which the following steps are carried out for each occurrent pulse: charging of a first capacitor in series with a second capacitor in dependence on one of the edges of the electric pulse, wherewith the first capacitor is charged with a charge that is determined essentially by the second capacitor and thereafter retains said charge, comparing the voltage across the first capacitor with a threshold level, and indicating that a given number of pulses have been counted when the voltage exceeds the threshold level.

The present invention provides several advantages. Firstly, it is simple and inexpensive because it contains no digital counter circuits. Secondly, it is not dependent on certain special voltage levels, in distinction to digital circuits. It also counts pulses irrespective of the pulse quotient of the pulses.

The invention will now be described in more detail with reference to preferred embodiments thereof and also with reference to the accompanying drawings.

DETAILED DESCRIPTION OF PREFERRED EMBODIMENTS

Figure 1:
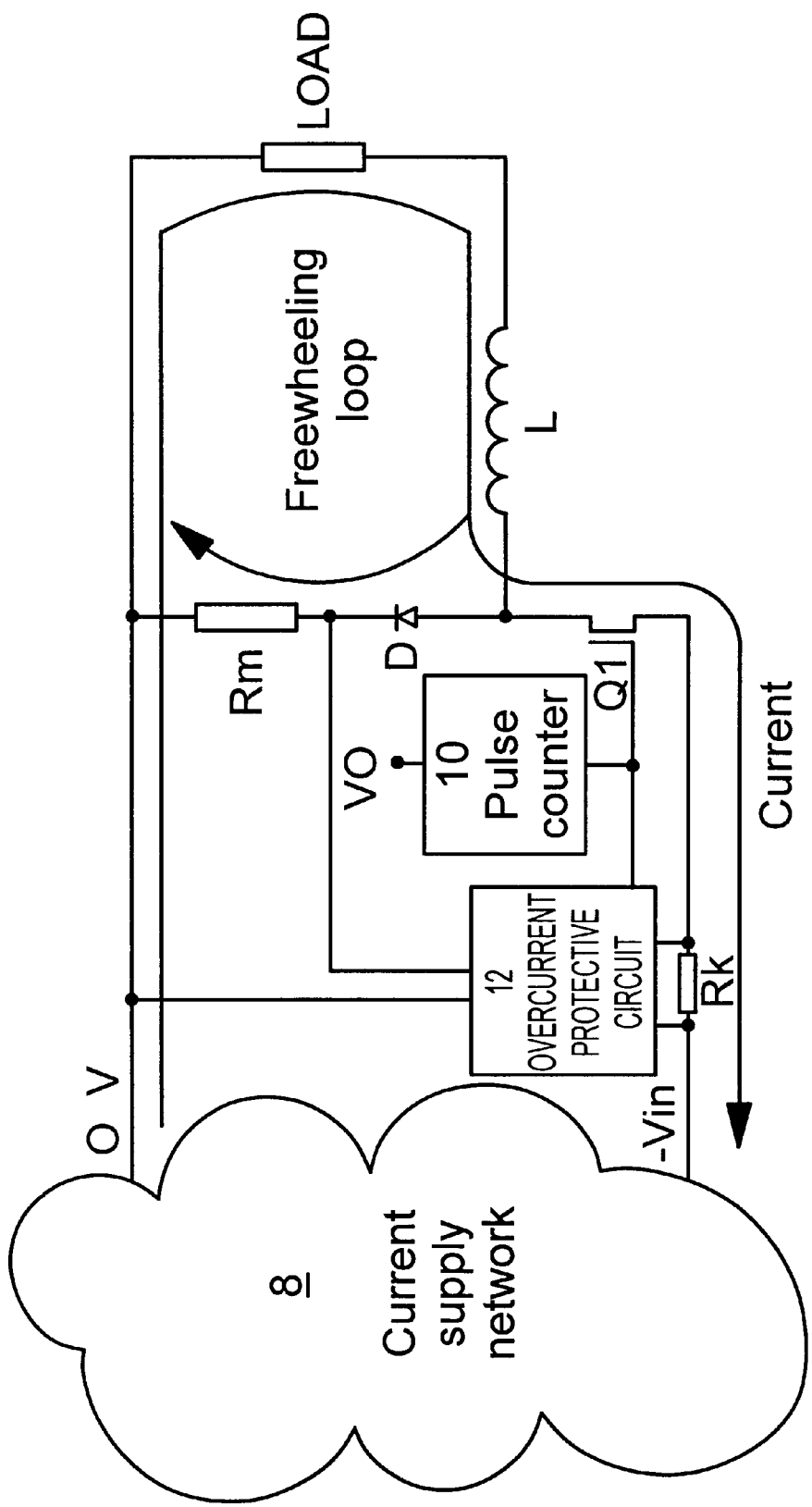
FIG. 1 is a circuit diagram illustrating a device for counting pulses in accordance with the invention and connected to an overcurrent protective circuit, and a pair of electric conductors connected to a current supply network.

FIG. 1 illustrates a current supply network 8 to which a first and a second electric conductor are connected, the first conductor having the potential 0 V and the second conductor having the potential −Vin, this latter potential normally being −48 V. The current supply network delivers direct current and will preferably include an alternating voltage network and d.c. converter. A load, which is normally capacitive or partially capacitive, is connected between the two electric conductors. The load may, for instance, be a telephone exchange. A number of components are connected in the second conductor between the load and the current supply network 8. Thus, the load in this second conductor is connected a choke L which, in turn, is connected to a controllable current valve Q1 in the form of a field effect transistor. The field effect transistor is, in turn, connected to a first measuring resistance Rk connected to the current supply network 8. A freewheeling diode D in series with a second measuring resistance Rm is connected between the first conductor and the connecting point between the current valve Q1 and the choke L. A pulse counter 10 is connected between the gate of the current valve Q1 and a supply potential VO. Finally, an overcurrent protective circuit 12 is connected with an input across the first measuring resistance, with a connection to the gate of the field effect transistor, with a connection to the connection point between the second measuring resistance Rm and the freewheeling diode D, and with a connection to the first conductor. The two measuring resistances Rk and Rm, the freewheeling diode D, the current valve Q1, the overcurrent protective circuit 12 and the pulse counter 10 together form an electronic fuse. The potential VO that lies between the conductor potentials is conveniently produced by dividing the voltage on the two conductors or by coupling-in a voltage regulator. The manner in which different potentials can be obtained from a voltage available on a conductor will be obvious to the person of normal skill in this art and will not therefore be explained in detail in this document.

The device illustrated in FIG. 1 operates as follows: The current valve Q1 is initially open and the overcurrent protective circuit 12 detects a current delivered to the load from the current supply network 8. When current begins to flow from the network 8 to the load in order to set the load in operation, the current will initially be very high when the load is capacitive. Part of this current, however, is reduced as a result of charging the choke L. However, after the choke L has been charged, large currents will nevertheless arise if the load is very large. The current to the load is sensed in the first measuring resistance Rk and the overcurrent protective circuit 12 sends to the valve gate a control signal of low potential when the current is higher than a given first value, e.g. 12 A, so as to close the valve. This prevents current from passing from the load to the current supply network 8 via the second conductor. Instead, current stored in the choke 11 passes through a freewheeling loop that comprises the load, the choke L, the freewheeling diode D and the second measuring resistance Rm. The overcurrent protective circuit 12 thus senses the current flowing through the second measuring resistance Rm and reopens the current valve Q1 when said current then falls beneath a determined second value that is lower than the first value, e.g. 8 A. Those skilled in this art are well aware that a current valve in the form of a field effect transistor is opened and closed by applying a voltage across its gate. In this way, there can be formed pulses which close and open the valve Q1 when the capacitive load requires larger currents to get charged. The current valve can be closed and opened in this way such that a current having a mean value of about 10 A will pass from the network 8 to the load. The pulse counter 10 counts the edges of the pulses that are delivered to the gate of the current valve Q1 in this way, and when a given number of pulse edges have been counted the device 10 closes the valve Q1 and prevents the overcurrent protective circuit from delivering pulses. This is done to protect the valve Q1, which would otherwise be subjected to a breakdown hazard.

As before mentioned, the overcurrent protective circuit 12 is closed by the current valve Q1 in the event of an overload, such as when starting-up. It will be understood, however, that the valve will also close the circuit in the event of a short circuit. As a result of these two different events, the time over which the current valve is closed during a pulse duration will vary significantly, and the pulse quotient will also vary, of course. However, it is necessary to count all pulses, to ensure that the current valve will not break down.

Figure 2:
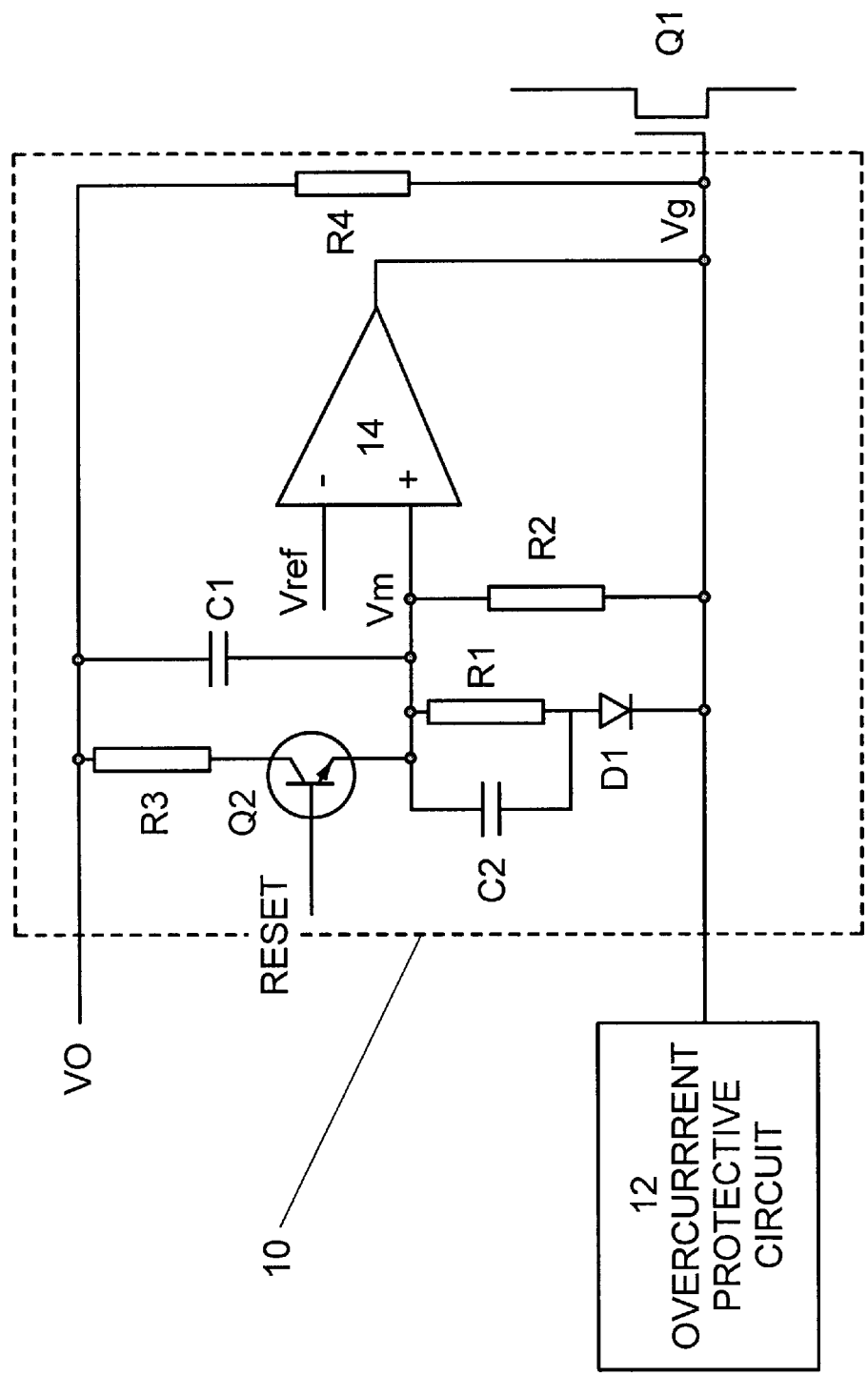
FIG. 2 is a circuit diagram of a pulse-counting device in accordance with a preferred embodiment of the invention.

FIG. 2 illustrates the inventive pulse counter 10. A first capacitor C1 is connected between the supply potential VO, which preferably lies about ten volts above the potential of the second conductor in FIG. 1 and is thus −Vin+10 V, and a first input or positive input of a comparison means 14 in the form of a comparator. A pump circuit is connected between the positive input of the comparison means 14 and the gate of the current valve Q1, and includes a first resistance R1 in series with a first diode D1 as well as a second resistance R2 connected in parallel with these. The anode of the first diode D1 is connected to the first resistance R1 and the cathode of said diode is connected to the gate of the valve Q1. The pump circuit also includes a second capacitor C2 connected in parallel with the first resistance R1. The first capacitor C1 is much larger than the second capacitor C2, for instance at least ten times as large. The second resistance R2 is also much larger than the first resistance R1, for instance at least ten times as large. Also shown in the Figure is the overcurrent protective circuit 12 connected to the valve gate. The circuit 12 delivers signals having voltages that vary between the earlier mentioned potentials VO and −Vin. A third resistance R3 in series with a first bipolar transistor Q2 are connected in parallel with the first capacitor C1. The emitter of the first bipolar transistor Q2 is connected to the positive input of the comparison means 14 and the collector of the transistor Q2 is connected to the third resistance R3. A fourth resistance R4 is connected between the supply voltage VO and the gate of the valve Q1. This fourth resistance R4 is a pull-up resistance which ensures that the control pulses applied across the valve gate will actually reach the potential VO. A reference voltage or comparison potential Vref is applied to a second input or a negative input of the comparison means 14, where said comparison potential Vref is suitably obtained by dividing the supply voltage VO. The Figure also shows the potential Vm at the positive input of the comparison means 14, the potential Vg at the gate of the valve Q1, and a resetting signal Reset at the base of the bipolar transistor Q2.

Figure 3A:
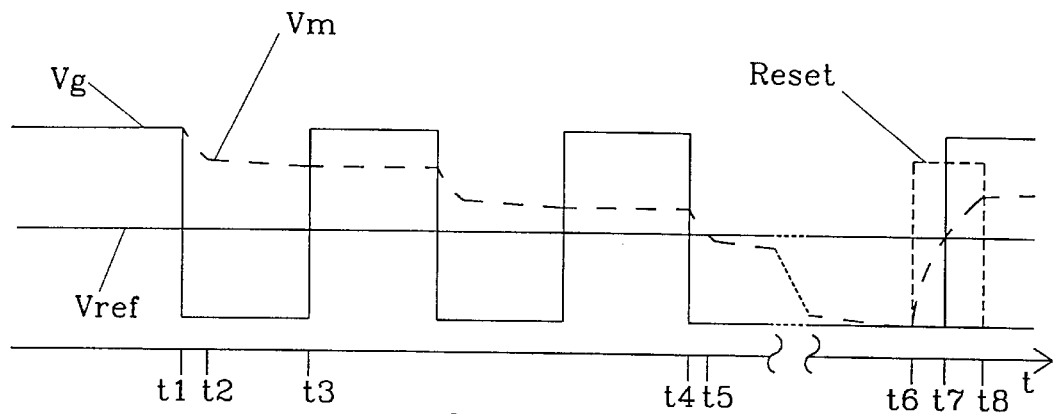
FIG. 3A illustrates curves representative of voltages that occur in FIG. 2.

FIG. 3A shows these different potentials and signals schematically as a function of the time t, which is shown on a time axis. The potential Vg at the gate of the valve is shown here to vary between two voltage states, said states being the earlier mentioned potentials −Vin and VO and occur first as a high voltage level followed by a periodically varying voltage in the form of two pulses having a pulse quotient of 50%. Subsequent to these pulses, where the first begins at a first point in time t1 and the last terminates at a fourth point in time t4, the potential Vg has a low level over a long period of time. In order to reduce the size of the Figure, only the beginning and the end of this time period is shown in the Figure, by drawing the voltage in a broken line and by interrupting the time axis at given intervals. The potential Vg at the gate of the current valve finally returns to a high level at a seventh point in time t7 on the time axis. The potential Vm at the positive input of the comparison means has here initially the same level as the potential Vg at the gate of the current valve when this potential is high. When the gate obtains a low voltage level at a first point in time t1, the potential Vm at the positive input of the comparison means 14 falls, first rapidly and then very slowly at a second point in time t2, and then maintains an even level when the gate next obtains a high level at a third point in time t3. The voltage Vm then falls in this way each time the gate obtains a low level. When the gate has received its second and last pulse, which is terminated at the point in time t4, the potential Vm falls in the same way as earlier, although no new pulse occurs on the gate and the potential Vm continues to fall slowly to the low gate potential. The curve over the potential Vm at the positive input of the comparison means 14 is shown here with a steep slope in a part that coincides with the interruption of the time axis. Naturally, the potential does not fall in this interval in the same rapid way shown in the Figure, and the curve is drawn in this way solely to illustrate more clearly how the curve hangs together. The potential Vm then rises quickly from a sixth point in time t6 to an eighth point in time t8, whereafter it rises very slowly. The comparator potential Vref at the negative input of the comparison means 14 is also drawn as a horizontal line, and the potential corresponds to roughly half of the maximum gate potential. The potential Vm crosses this comparison potential Vref at a fifth point in time t5. A resetting pulse Reset is drawn at the end of the curve and begins at the sixth point in time t6, at which this pulse coincides with the last rise of the potential Vm at the positive input of the comparison means 14 and terminates at the eighth point in time t8. The voltages, potentials and times are not drawn to scale, but are shown purely schematically to provide a better understanding of the invention.

The way in which the device in FIG. 2 operates will now be described with reference to FIG. 3A. In normal operation, the voltage output of the overcurrent protective circuit 12 to the gate of the current valve Q1 is constantly high and the capacitors C2 and C1 have no charge. When the voltage output of the overcurrent protective circuit 12 later switches to a low potential (the potential −Vin in FIG. 1), i.e. at the negative edge of the first pulse at the first point in time t1, a voltage difference occurs between the potential VO and the gate of the current valve Q1. This voltage difference causes the first and the second capacitors C1 and C2 to be charged in series. This series charging of the capacitors is almost instantaneous, even though not shown in FIG. 3A. Because the second capacitor C2 is much smaller than the first capacitor C1, the second capacitor C2 will be charged long before the first capacitor C1 can be fully charged, this charging of the second capacitor C2 being completed at the second point in time t2. The first capacitor C1 has then been charged with the same charge as the second capacitor C2, although this charge will not, of course, completely fill the first capacitor C1, but only provides a very small contribution that only increases the voltage across the first capacitor C1 to a small extent. Although greatly exaggerated, this voltage change is made evident by the fact that the potential Vm has fallen between the first and the second point in time t1 and t2 in FIG. 3A. Charging of the first capacitor C1 then continues via the first resistance R1, up to the third point in time t3. This takes place much more slowly than charging of the capacitor between the first and the second point in time t1 and t2 and is almost negligible in comparison. When the potential Vg at the gate of the current valve Q1 then goes high at the third point in time t3, the first capacitor C1 retains substantially the charge that it has received between the first and the third point in time t1 and t3. Admittedly, the first capacitor C1 is then discharged, but the discharge is done, due to the first diode D1, through the second resistance R2. Since the second resistance R2 is much larger than the first resistance R1, this emptying of the capacitor is much slower than the already slow charging of the first capacitor that occurred between the second and the third point in time t1 and t3. The second capacitor C2, on the other hand, is emptied completely through the first resistance R1 during the time at which the potential Vg at the gate is high.

This procedure is then repeated in a similar manner for all pulses, until the voltage across the first capacitor C1 has become so high that the potential Vm at the positive input of the comparison means 14 has become so low as to fall beneath the comparison potential Vref, which occurs in FIG. 3A after the second pulse at the fifth point in time t5. A specific number of pulses has thus been counted up to this point in time. The low potential Vm at the positive input of the comparison means 14 causes the comparison means 14 to indicate that an approximate number of pulses have been counted and to close the current valve by striving, by means of its output, to draw the Vg down to its lowest level and the potential Vm thus continues to fall slowly until it reaches the lowest level of the gate. This low level is maintained until a resetting pulse Reset is applied to the base of the bipolar transistor Q2, which takes place at a sixth point in time t6. The voltage across the first capacitor C1 is equal to the potential VO minus the potential Vm. Thus, it is not actually the voltage across the first capacitor C1 that is compared with the potential Vref in the comparison means. The potential Vm is, however, dependent on the voltage across the first capacitor C1 and this can be seen as the voltage across the first capacitor being compared with a threshold level that is equal to the potential VO minus the potential Vref, and that the aforementioned indication is made when the voltage across the first capacitor is higher than the threshold level. The resetting pulse Reset activates the first bipolar transistor Q2 such as to connect the third resistance R3 with the positive input of the comparison means 14. The first capacitor C1 is therewith discharged through the third resistance R3. This third resistance R3 is a small resistance and much smaller than the first resistance R1, which is at least ten times larger for instance, so that said discharge will take place relatively quickly. The reset impulse, however, is only of a length such as to cause the first capacitor C1 to discharge through the third resistance R3 up to the point at which the potential Vm at the positive input of the comparison means 14 rises above the comparison potential Vref, which occurs at the seventh point in time t7. This causes the comparison means 14 to strive to maintain the potential Vg at the valve gate on a high level. This high level will be present in the normal case, i.e. after rectifying the cause of the high current in the case of a short circuit. The first capacitor C1 is then discharged through the second resistance R2, since the gate potential Vg is again high.

The aforedescribed pulse counting device has several advantages. It is inexpensive and is able to count an approximate number of pulses when the pulse quotient is able to vary considerably. It also takes up only a small amount of space and can be used at voltage levels that are normally troublesome to digital circuits.

Figure 3B:
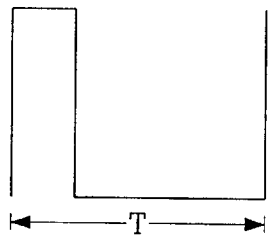
FIGS. 3B and 3C illustrate pulses that have different pulse quotients.
Figure 3C:
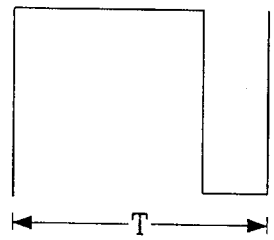

FIG. 3B shows a pulse that has a low pulse quotient, i.e. has a high potential over a shorter time period than it has a low potential, and FIG. 3C shows a pulse that has a high pulse quotient, i.e. has a low potential for a shorter time than it has a high potential. Both pulses have the combined period time T.

It has been found that this period time is normally relatively constant, e.g. a duration of $10\,\mu s$ for pulses that are generated by an overcurrent protective circuit 12 that operates in the aforedescribed manner. This period time is determined for a particular load essentially by the size of the choke. However, short circuits have been found to have a low pulse quotient, as in FIG. 3B, whereas overloads have varying pulse quotients and then often high pulse quotients, as in FIG. 3C, when charging of a capacitive load requires currents that lie only slightly above the current magnitude at which the overcurrent protective circuit closes the current valve. The choice of size of the components included in the pulse counter are then dependent on a number of different factors. This choice begins with studying how long the current valve is able to oscillate (toggle) and by dividing this time with the number of pulses (periods) that are liable to occur. Because the pulse counter 10 does not count the number of pulses exactly, this value is preferably rounded downwards so as to obtain a suitable margin. A pulse that has the highest pulse quotient is then selected and the second capacitor and the second resistance are chosen so that the fully charged second capacitor will discharge fully during the time over which this pulse goes low. Converse dimensioning for charging at pulses having low pulse quotients is not equally as essential. The size of the first capacitor is then chosen. If the comparison potential is assumed to be half the pulse size, the first capacitor is given a size with which the number of periods T divided by two will be equal to the ratio between the first capacitor and the second capacitor, where a division by two is made in order to take the chosen comparison potential into account. Thus, if 5,000 pulses are to be counted, the first capacitor is chosen to be 10,000 times larger than the second capacitor. At the same time, the first resistance must be sufficiently large in order for the first capacitor C1 to be charged only marginally when the second capacitor has been charged fully, i.e. charging between the second and the third point in time in FIG. 3A. The first resistance is also chosen to be large enough not to influence the discharging/charging sequence when pulses occur. Naturally, the third resistance is chosen to be as small as possible, in order to quickly discharge the first capacitor. In one case, the first capacitor has a size of 1 $\mu$F, the second capacitor a size of 100 pF, the first resistance a size of 100 k$\Omega$, the second resistance a size of 100 M$\Omega$ and the third resistance a size of 1 k$\Omega$. In this case, the pulses vary between −38 and −48 V and the comparison potential was −43 V. The time taken to close the current valve and to indicate counting of a given number of pulses can also be varied by varying the comparison potential.

Figure 4:
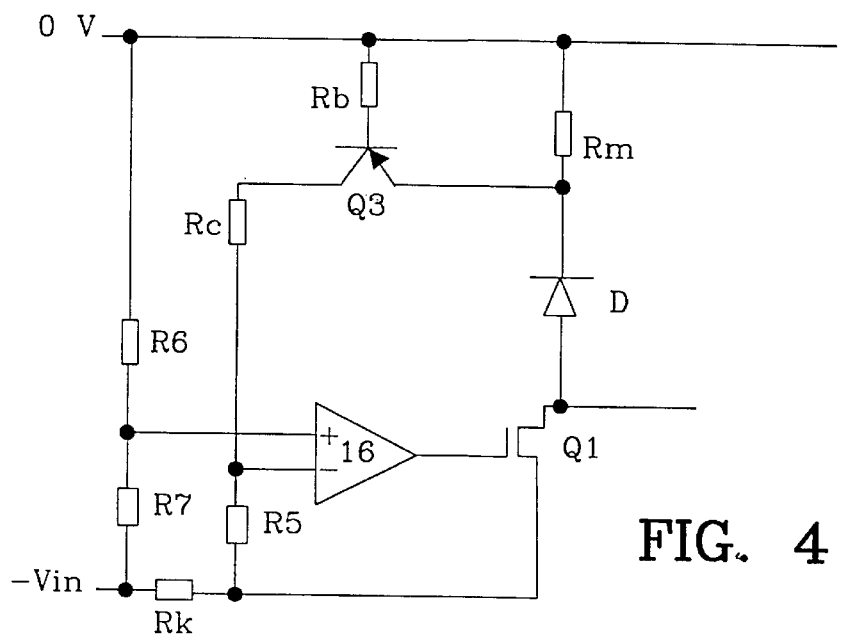
FIG. 4 illustrates an overcurrent protective circuit suitable for use together with the inventive pulse-counting device.

FIG. 4 illustrates an example of an overcurrent protective circuit which is suitable for use together with the inventive pulse counter. Those components of the FIG. 4 embodiment that find correspondence in FIG. 1 have been identified by the same reference signs and are mutually connected in the same way as that illustrated in FIG. 1. The manner in which these components are mutually connected will not therefore be described with reference to FIG. 4. As in the earlier case, the first conductor has the potential 0 V and the second conductor the potential −Vin. The overcurrent protective circuit includes a comparator 16 having an output connected to the gate of the current valve Q1. This comparator 16 has a negative input which is connected to the connection point between the first measuring resistance Rk and the current valve Q1 by means of a fifth resistance R5. The comparator 16 also has a positive input which is connected to the first conductor via a sixth resistance R6 and to the connection point between the current supply network (not shown) and the first measuring resistance Rk by means of a seventh resistance R7. The emitter of a second bipolar transistor Q3 is connected to the connection point between the second measuring resistance Rm and the freewheeling diode D and the base of the second transistor is connected to the first conductor via an eighth resistance Rb, while the collector of said transistor is connected to the negative input of the comparator 16 via a ninth resistance Rc.

The circuit operates in the following manner: Assume first that the circuit has been in operation for a given period of time, i.e. current has passed from the network to the load (not shown) via the first conductor having potential 0 V, and back to the network via the second conductor having potential −Vin. Energy has herewith been stored in the choke (not shown). If the current through the first measuring resistance Rk then exceeds a given value, the comparator 16 changes state and therewith closes the transistor Q1 and the energy stored in the choke passes as current in the freewheeling loop that includes the freewheeling diode D and the second measuring resistance Rm. The freewheeling current has initially the same value as the value of the current passing through the second conductor immediately prior to closing the current valve Q1. The second bipolar transistor Q3 is then opened fully for the voltage that corresponds to the current passing through the second measuring resistance Rm. The resistances Rc and R5 are dimensioned so that the voltage on the negative input of the comparator 16 will be higher than the voltage on its positive input for the freewheeling current of this magnitude. This causes the comparator 16 to keep the current valve Q1 closed, despite the fact that no current flows through the first measuring resistance Rk. The freewheeling current then decreases and when said current has decreased to a predetermined value, the comparator 16 switches to a second state and reactivates the transistor Q1. This is possible because the resistances Rc, Rb, R5 and Rm are dimensioned so that the bipolar transistor Q3 will be cut-off for the freewheeling current with this lower value.

It will be understood that the invention is not restricted to the aforedescribed and illustrated exemplifying embodiments thereof, and that modifications can be made within the scope of the following Claims. For instance, the comparison means in the pulse counter need not be a comparator, but may just as well be a transistor. Neither need the current valve be a field effect transistor, but may be any other type of transistor or another type of controllable current valve, such as some form of thyristor, for instance. The first bipolar transistor Q2 may also be replaced with some other form of switch. For instance, a relay may be used. The invention is generally useful in all cases where pulses shall be counted and where accuracy of the pulse count is of subordinate interest. The pulse counting described in the aforegoing relates to counting the negative edges of the pulses, although counting of positive pulse edges is also possible through ensuring that the pulses are applied at the point in FIG. 2 that has the potential VO. In this case, the output of the comparison means would not, of course, be connected to the first capacitor via the pull-up resistance, but would be connected to a supply potential in some other way, as those skilled in this field will understand. In the aforegoing, the comparison potential has been described as being connected to the negative input of the comparison means and the potential corresponding to the voltage across the first capacitor has been connected to the positive input of said comparison means. Naturally, the converse case is also feasible for indicating that a given number of pulses have been counted, i.e. the comparison potential is connected to the positive input of the comparison means and the potential corresponding to the voltage across the first capacitor is connected to the negative input of said comparison means.

We claim:
1. A device for counting the edges of electric pulses, characterized by a first capacitor (C1) connected in series with a pump circuit that includes a first resistance (R1) in series with a first diode (D1) both connected in parallel with a second resistance (R2), and a second capacitor (C2) connected in parallel with the first resistance so that when a voltage (Vg) caused by one of the edges of an electric pulse is applied across the first capacitor and the pump circuit, the first and the second capacitors are charged in series with a charge that is essentially determined by the second capacitor, said device further including a comparison means (14) having a first input connected to the connection point between the first capacitor and the pump circuit and a second input connected to a comparison potential (Vref) in order to indicate that a given approximate number of pulses have been counted when the voltage (Vm) across the first capacitor exceeds a threshold level determined by the comparison potential.

2. A device according to claim 1, characterized in that the second resistance (R2) is much larger than the first resistance (R1), and preferably more than ten times as large.

3. A device according to claim 2, characterized in that the first capacitor (C1) is much larger than the second capacitor (C2), and preferably more than ten times as large.

4. A device according to claim 3, characterized in that the second capacitor (C2) and the first resistance (R1) are chosen so that the second capacitor will be fully discharged during the time that a pulse having the lowest occurrent pulse quotient has a high voltage level, or during the time that a pulse having the highest occurrent pulse quotient has a low voltage level.

5. A device according to claim 1, characterized in that the first and the second capacitors (C1, C2) have a mutual size relationship that is at least partially determined by the number of pulse edges to be counted.

6. A device according to claim 1, characterized by an output on the comparison means (14) that is intended for connection to a controllable current valve (Q2), wherein the comparison means is adapted to close the current valve when the voltage across the first capacitor (C1) exceeds the threshold value determined by the comparison potential (Vref).

7. A device according to claim 1, characterized by a third resistance (R3) in series with a first transistor (Q2) which are connected in parallel with the first capacitor (C1) to enable emptying of the first capacitor (C1) when said indication has been made.

8. An electronic fuse comprising a current valve (Q1) for connection in an electric conductor to which a load is connected, and an overcurrent protective circuit (12) connected to a gate on the current valve, said overcurrent protective circuit generating pulses (Vg) for closing and opening the current valve in dependence on the magnitude of currents passing through the load, characterized by a device (10) for counting the edges of said pulses and including a first capacitor (C1) connected in series with a pump circuit which includes a first resistance (R1) in series with a first diode (D1) both connected in parallel with a second resistance (R2), and a first capacitor (C2) connected in parallel with the first resistance such that when a voltage is caused by one of the pulse edges and generated by the overcurrent protective circuit is applied across the first capacitor and the pump circuit, the first and the second capacitors are charged in series with a charge that is determined essentially by the second capacitor, wherein a first input of a comparison means (14) is connected to the connection point between the first capacitor and the pump circuit, and a second input of said comparison means is connected to a comparison potential (Vref) and an output of said comparison means is connected to the gate of the current valve (Q1) for indicating that a given approximate number of pulses have been counted and to close the current valve when the voltage across the first capacitor exceeds a threshold level determined by the comparison potential.

9. A method of counting the edges of electric pulses, characterized by the steps of, for each occurrent pulse, charging a first capacitor (C1) in series with a circuit that includes a second capacitor (C2) in dependence on one of the edges of the electric pulse (Vg), wherein the first capacitor is charged with a charge that is determined essentially by the second capacitor and thereafter retains this charge, comparing the voltage (Vm) across the first capacitor with a threshold level, and indicating that a given number of pulses have been counted when the voltage across the first capacitor exceeds the threshold level.

10. A method according to claim 9, characterized in that charging of the first capacitor (C1) takes place much more quickly than the discharging of said first capacitor.

11. A method according to claim 9, characterized in that the second capacitor (C2) is charged essentially fully when one of the edges of a pulse occurs, and is discharged fully prior to a corresponding edge of a following pulse occurring.

* * * * *